(12) United States Patent
Dammel et al.

(10) Patent No.: US 6,737,215 B2
(45) Date of Patent: May 18, 2004

(54) PHOTORESIST COMPOSITION FOR DEEP ULTRAVIOLET LITHOGRAPHY

(75) Inventors: Ralph R. Dammel, Flemington, NJ (US); Raj Sakamuri, Sharon, MA (US)

(73) Assignee: Clariant Finance (BVI) Ltd, Tortola (VG)

( * ) Notice: Subject to any disclaimer, the term of this patent is extended or adjusted under 35 U.S.C. 154(b) by 164 days.

(21) Appl. No.: 09/853,732

(22) Filed: May 11, 2001

(65) Prior Publication Data

US 2002/0187419 A1 Dec. 12, 2002

(51) Int. Cl.$^7$ .................. G03F 7/004; C08F 120/42
(52) U.S. Cl. .................. 430/270.1; 430/286.1; 430/322; 430/326; 430/905; 430/910; 526/297; 526/342
(58) Field of Search .......... 430/270.1, 286.1, 430/320, 322, 330, 326, 905, 910; 526/297, 342, 341; 524/565

(56) References Cited

U.S. PATENT DOCUMENTS

| | | | |
|---|---|---|---|
| 4,491,628 A | 1/1985 | Ito et al. | 430/176 |
| 4,812,546 A | 3/1989 | Meurer et al. | 526/297 |
| 5,350,660 A | 9/1994 | Urano et al. | 430/176 |
| 5,399,647 A | 3/1995 | Nozaki | 526/297 |
| 5,843,624 A | 12/1998 | Houlihan et al. | 430/296 |
| 6,159,655 A | 12/2000 | Sato | 430/270.1 |
| 6,165,674 A | 12/2000 | Taylor et al. | 430/270.1 |
| 6,509,134 B2 * | 1/2003 | Ito et al. | 430/270.1 |

FOREIGN PATENT DOCUMENTS

| | | | |
|---|---|---|---|
| EP | 0 794 458 A2 | 9/1997 | G03F/7/004 |
| EP | 0 930 542 A1 | 7/1999 | G03F/7/039 |
| EP | 0 982 628 A | 3/2000 | G03F/7/004 |
| EP | 1 091 249 A | 4/2001 | G03F/7/039 |
| GB | 2 3 207 18 A | 7/1998 | C08F/32/08 |
| WO | WO 00/17712 | 3/2000 | G03F/7/039 |
| WO | WO 00/67072 | 11/2000 | G03F/7/039 |
| WO | WO 01/37047 A2 | 5/2001 | G03F/7/004 |

OTHER PUBLICATIONS

PCT/EP 02/04558 Copy of PCT Search Report.

* cited by examiner

*Primary Examiner*—Yvette C. Thornton
(74) *Attorney, Agent, or Firm*—Sangya Jain

(57) ABSTRACT

The present invention relates to a photoresist composition sensitive in the deep ultraviolet region and a method of processing the photoresist, where the photoresist comprises a novel copolymer, a photoactive component, and a solvent. The novel copolymer comprises a unit derived from an ethylenically unsaturated compound containing at least one cyano functionality and a unit derived from an unsaturated cyclic non aromatic compound.

22 Claims, No Drawings

PHOTORESIST COMPOSITION FOR DEEP ULTRAVIOLET LITHOGRAPHY

FIELD OF INVENTION

The present invention relates to a novel photoresist composition that is particularly useful in the field of microlithography, and especially useful for imaging negative and positive patterns in the production of semiconductor devices. The photoresist composition comprises a novel copolymer and a photoactive component, where the copolymer comprises a unit derived from an ethylenically unsaturated compound containing at least one cyano functionality and a unit derived from an unsaturated cyclic non aromatic compound. The polymer of the novel photoresist has high transparency in the deep ultraviolet (uv) region, and such a composition is especially useful for exposure at 193 nanometers (nm) and 157 nm. The invention further relates to a process for imaging the novel photoresist.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist. The trend towards the miniaturization of semiconductor devices has led to the use of new photoresists that are sensitive at lower and lower wavelengths of radiation and has also led to the use of sophisticated multilevel systems to overcome difficulties associated with such miniaturization.

There are two types of photoresist compositions, negative-working and positive-working. The type of photoresist used at a particular point in lithographic processing is determined by the design of the semiconductor device. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Photoresist resolution is defined as the smallest feature which the resist composition can transfer from the photomask to the substrate with a high degree of image edge acuity after exposure and development. In many leading edge manufacturing applications today, photoresist resolution on the order of less than one-half micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Photoresists sensitive to short wavelengths, between about 100 nm and about 300 nm are often used where subhalfmicron geometries are required. Particularly preferred are photoresists comprising non-aromatic polymers, a photoacid generator, optionally a dissolution inhibitor, and solvent.

High resolution, chemically amplified, deep ultraviolet (100–300 nm) positive and negative tone photoresists are available for patterning images with less than quarter micron geometries. To date, there are three major deep ultraviolet (uv) exposure technologies that have provided significant advancement in miniaturization, and these use lasers that emit radiation at 248 nm, 193 nm and 157 nm. Photoresists for 248 nm have typically been based on substituted polyhydroxystyrene and its copolymers, such as those described in U.S. Pat. No. 4,491,628 and U.S. Pat. No. 5,350,660. On the other hand, photoresists for 193 nm exposure require non-aromatic polymers, since aromatics are opaque at this wavelength. U.S. Pat. No. 5,843,624 and GB 2320718 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon:hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers, but the presence of maleic anhydride makes these polymers insufficiently transparent at 157 nm. Until now photoresists sensitive at 157 nm have been based on fluorinated polymers, which are known to be substantially transparent at that wavelength. Photoresists derived from polymers containing fluorinated groups are described in WO 00/67072 and WO 00/17712. However, the polymerization of unsaturated fluorinated monomers, such as tetrafluoroethylene, presents severe explosion hazards and a great deal of care needs to be exercised during the polymerization process. Polymerization processes that are environmentally safer are preferred.

The inventors of this application have found that polymers containing cyano groups are transparent at wavelengths below 200 nm. Polymers derived from certain monomers containing cyano functionality are known. U.S. Pat. No. 6,165,674 discloses polymers derived from itaconic anhydride, acrylates with a cyano group and acrylate with a pendant alicyclic group. U.S. Pat. No. 5,399,647 discloses a copolymer of 1-(1'-cyanoethynyl)adamantane and methacrylates or 2-norbornene-2-carbonitrile and methacrylates.

The reaction scheme to introduce the cyano group into the unsaturated bond of an alicyclic compound, in order to synthesize 2-norbornene-2-carbonitrile, is difficult and undesirable. Therefore, there is a need for a monomer which can easily copolymerize with cyclic olefins, and yield a polymer which possesses good plasma etch resistance. There is also a need for a monomer that can be made using simple techniques such as Diels Alder reactions of cyclopentadiene and olefins. Polymers based only on unsaturated cyclic monomers that are resistant to plasma etching are also known but they require transition metal catalysts, which are undesirable due to the high likelihood of metal contamination of the semiconductor device. U.S. Pat. No. 4,812,546 discloses an acrylate rubber (terpolymer) of n-butyl acrylate, methyl cyanoacrylate and ethylidene norbornene, where ethylidene norbornene creates a crosslinkable sites for vulcanization. Such crosslinked copolymers are useful only in the rubber/adhesive industry.

The object of this invention is to provide a novel photoresist that comprises a polymer that can be synthesized by free radical polymerization, is also transparent at wavelengths below 200 nm, especially 193 nm and 157 nm, and provides good lithographic performance when it is formulated into a photoresist.

The present invention pertains to a novel photoresist composition comprising a novel polymer and a photosensitive compound. The composition is particularly useful for imaging in the range of 100–300 nm, and more particularly for 157 nm and 193 nm. The novel polymer is a copolymer comprising a unit derived from an ethylenically unsaturated compound containing at least one cyano functionality and a unit derived from an unsaturated cyclic non aromatic compound. This copolymer is transparent below 200 nm, it can be synthesized by free radical polymerization and has good dry etch resistance.

SUMMARY OF THE INVENTION

The invention relates to a novel photoresist composition comprising a photoactive compound and a copolymer comprising at least one unit derived from an ethylenically unsaturated compound containing at least one cyano functionality and at least one unit derived from an unsaturated cyclic non-aromatic compound. Preferably the ethylenic unit ranges from 40 mole % to 80 mole % in the copolymer.

The invention further relates to a process for imaging the novel photoresist, particulaly at wavelengths in the range 100 nm–200 nm, and more particularly for imaging at 193 nm and 157 nm.

DESCRIPTION OF THE INVENTION

The present invention relates to a photoresist composition comprising a novel copolymer and a photosensitive compound. The novel copolymer comprises a unit derived from an ethylenically unsaturated compound containing at least one cyano functionality and a unit derived from an unsaturated cyclic non aromatic compound. The photosensitive composition is particularly useful for forming images in the deep uv region due to the transparency of the novel polymer in the that region, and the composition is more particularly useful for imaging in the 100–200 nm region. The photosensitive composition has been found to be especially useful for imaging at 193 nm and 157 nm, since few polymers are both transparent at this wavelength and also possess sufficient plasma etch resistance.

The unit in the novel copolymer derived from an ethylenically unsaturated compound containing at least one cyano functionality has the structure;

(1)

where, $R_1$–$R_4$ are independently hydrogen, alkyl, O-alkyl, alkyl ester, perfluoroalkyl ester, carboxylic acid, alkylcarbonyl, carboxylate, cyano(CN), fluoroalkyl, acid or base labile group, alkylsulfonyl, sulfonate, sulfonamide, alkylsulfonamide, providing that at least one of $R_1$–$R_4$ contains a cyano functionality. Preferably no more than two cyano groups are present in one monomer. It is more preferable that at least one of $R_1$–$R_4$ is a cyano group, and even more preferable that two of $R_1$–$R_4$ are cyano groups.

In the above definition and throughout the present specification, alkyl means linear and branched alkyl having the desirable number of carbon atoms and valence. Furthermore, alkyl also includes aliphatic cyclic groups, which may be monocyclic, bicyclic, tricyclic and so on. Suitable linear alkyl groups include methyl, ethyl, propyl, butyl, pentyl, etc.; branched alkyl groups include isopropyl, iso, sec or tert butyl, branched pentyl, hexyl, heptyl, octyl, etc; monocyclic alkyl groups include cyclopentyl, cyclohexyl and cycloheptyl; bicyclic alkyl groups include substituted bicyclo[2.2.1]heptane, bicyclo[2.2.2]octane, bicyclo [3.2.1]octane, bicyclo[3.2.2]nonane, and bicyclo[3.3.2] decane, and the like. Examples of tricyclic alkyl groups include tricyclo[5.2.1.0$^{2,6}$]decane, tricyclo[5.4.0.0$^{2,6}$] undecane, tricyclo[4.2.2.1$^{2,5}$]undecane, and tricyclo [5.3.2.0$^{2,6}$]dodecane. Preferably the alkyl group is less than ten carbon atoms when used as a noncyclic structure, and more preferably less than six carbon atoms. Fluoroalkyl refers to an alkyl group which is fully or partially substituted with fluorine, examples of which are trifluoromethyl, pentafluoroethyl, etc. Acid or base labile groups are ones that are cleaved to give a group that makes the polymer soluble in the developer, when an acid or base is generated photolytically. Without limitation, examples of acid or base cleavable groups are tert-butoxycarbonyl, tert-pentyloxycarbonyl, isobornyloxycarbonyl, cyclohexyloxycarbonyl, 2-alkyl-2-admantyloxycarbonyl, tetrahydrofuranyloxycarbonyl, tetrahydropyranyloxycarbonyl, variously substituted methoxymethoxycarbonyl, β-carbonyloxy-β-methyl-δ-valerolactone, β-carbonyloxy-β-methyl-γ-butyrolactone, tert-butoxycarbonyloxy, tert-pentyloxycarbonyloxy, isobornyloxycarbonyloxy, cyclohexyloxycarbonyloxy, 2-alkyl-2-admantyloxycarbonyloxy, tetrahydrofuranyloxycarbonyloxy, tetrahydropyranyloxycarbonyloxy, variously substituted methoxymethoxycarbonyloxy, β-oxycarbonyloxy-β-methyl-δ-valerolactone, β-oxycarbonyloxy-β-methyl-γ-butyrolactone, tert-butoxy, tert-pentyloxy, isobornyloxy, cyclohexyloxy, 2-alkyl-2-admantyloxy, tetrahydrofuranyloxy, tetrahydropyranyloxy, variously substituted methoxymethoxy, β-oxy-β-methyl-δ-valerolactone, and β-oxy-β-methyl-γ-butyrolactone. The acid or base labile groups may be connected directly to the polymer backbone or through a connecting group, where examples of the connecting groups are carbon, ($C_1$–$C_6$)alkylene (e.g. methylene or ethylene) or alkynyloxycarbonyl.

Examples of the ethylenic monomer containing the cyano group are given below.

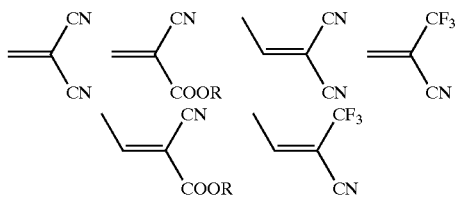

where, R is alkyl as previously defined.

The second unit in the novel polymer is derived from a monomer containing an unsaturated cyclic monomer and the unit is described by structure 2,

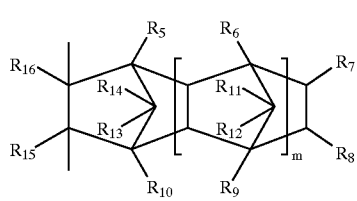

(2)

where $R_5$–$R_{14}$ are independently hydrogen, $(C_1$–$C_6)$alkyl, halogen, such as fluorine and chlorine, carboxylic acid, $(C_1$–$C_{10})$alkylOCOalkyl, cyano(CN), $(C_1$–$C_{10})$ secondary or tertiary carboxylate, substituted pinacol, $R_7$ and $R_8$ may be linked to form a cyclic non-aromatic structure, fluoroalkyl, $W(CF_3)_2OH$, where W is $(C_1$–$C_6)$alkyl or $(C_1$–$C_6)$alkyl ether, acid or base labile group as describe above, and $R_{15}$ and $R_{16}$ are hydrogen or $(C_1$–$C_4)$alkyl, and m is 0–3. Examples of where $R_7$ and $R_8$ may be linked to form a cyclic non-aromatic structure are lactones and anhydrides.

The structures below are illustrative of some of the comonomers that may be used. These comonomers may be further capped with acid or base labile groups and polymerized to give the polymer of the invention.

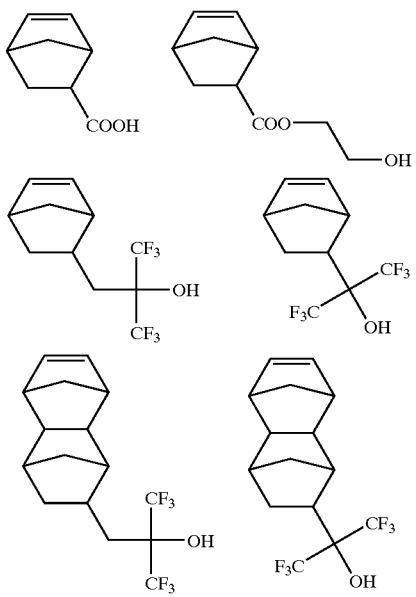

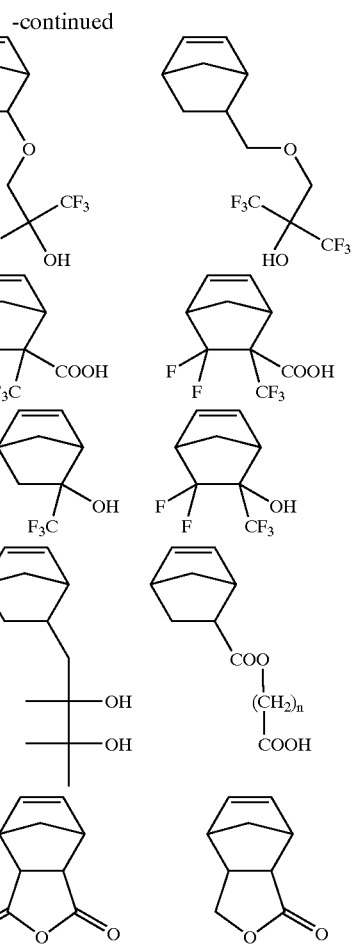

The novel polymer of this invention is polymerized to give a polymer with a weight average molecular weight from about 1,000 to about 200,000, preferably from about 4,000 to about 20,000, more preferably from about 6,000 to about 14,000. The polydispersity of the resin (Mw/Mn) where Mw is the weight average molecular weight and Mn is the number average molecular weight can range from 1.5 to 3.0, where the molecular weights of the resin may be determined by gel permeation chromatography, The polymer comprising the ethylenic unit and the cyclic unit are copolymerized in relative amounts that are optimized to give the desired lithographic properties. Typically the ratios of the two units in the novel polymer may range from 50 mole % to about 80 mole %, and preferably 50 mole % to about 65 mole %. The polymer contains at least 40 mole % of the ethylenic unit of structure 1. The incorporation of these units into the copolymer may be alternating, approximately alternating, block, or others, but is not limited to these structures.

The novel polymer of the invention may incorporate additional unsaturated monomers, which include, but are not limited to, acrylates, methacrylates, styrenes, in particular hydroxystyrene and hydroxyhexafluoroisopropylstyrene, vinyl ethers, vinyl acetates, tetrafluoroethylene, maleic anhydride and itaconic anhydride and their fluorinated homologues. The additional monomers may contain acid or base labile groups. These additional monomers may be added in amounts that still maintain the desired transparency of the polymer at the exposure wavelength. Preferably the additional monomers are incorporated into the polymer at amounts less than 30 mole %, preferably less than 25 mole %, and more preferably less than 15 mole %.

The polymer of this invention comprises one or more monomers that contain a protecting group that is an acid or base labile group. The protecting group is deprotected after exposure to give a polymer that is soluble in the developer for a positive photoresist or insoluble in the developer for a negative photoresist. The polymer may be capped with a protecting group after polymerization or the monomer(s) may be capped and then polymerized. The polymer may also be inhibited by a dissolution inhibitor, and upon exposure the photoresist then becomes soluble in the developer. Typically dissolution inhibitors are added to the photoresist to decrease the dissolution rate of the unexposed photoresist in the developer. Examples of known dissolution inhibitors that may be used are monomeric or oligomeric cholates.

Transparency of the polymer in the photoresist is an important requirement. Thus, the absorption coefficient of the copolymer is preferably less than 4/micron at the exposure wavelength, typically 157 nm, more preferably 3/micron and even more preferably less than 2/micron.

The novel copolymer of this invention may be prepared by a variety of methods. A method that is particularly preferred is free radical polymerization. Free radical polymerization is carried out by polymerizing the unsaturated monomers in the presence of a free radical initiator under appropriate conditions of temperature, pressure and reaction medium. The reaction may be carried out in an inert atmosphere and a desirable solvent may be used. In typical implementations, the reaction temperature will range from room temperature to 150° C. The reaction is typically carried out under nitrogen, although other inert gases, such as argon, or carbon dioxide may be used. The reaction time can range from 1 hour to 24 hours. Solvents that are suitable for the polymerization reaction may be used, examples of which are tetrahydrofuran, dioxane, and toluene. The polymerization can be carried out at ambient or under pressure, e.g., in solvents such as super critical $CO_2$. The polymer can be isolated by drowning in a nonsolvent, such as hexane, heptane or diethyl ether.

The photoresist composition comprises at least one photoactive compound that when exposed to radiation forms either an acid or a base, although an acid is most commonly used. In positive photoresists the generation of the acid typically deprotects the polymer, such that the photoresist becomes soluble in the exposed areas. The acid can alternatively cause the polymer to crosslink such that the photoresist becomes insoluble in the exposed areas, and such a photoresist is known as a negative photoresist. Any photoactive compound or mixtures of photoactive compounds may be used in the novel photoresist. Suitable examples of the acid generating photosensitive compounds include ionic photoacid generators (PAG), such as diazonium salts, iodonium salts, sulfonium salts, or non-ionic PAGs such as diazosulfonyl compounds, sulfonyloxy imides, and nitrobenzyl sulfonate esters although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluromethane sulfonate, triphenylsulfonium nonafluorobutane sulfonate and the like. Other compounds that form an acid upon irradiation that may be used, are triazines, oxazoles, oxadiazoles, thiazoles, substituted 2-pyrones. Phenolic sulfonic esters, bis-sulfonylmethanes, bis-sulfonylmethanes or bis-sulfonyldiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)methide, diphenyliodonium bis(trifluoromethylsulfonyl)imide and their homologues are also preferred. Mixtures of photoacid generators may also be used, and frequently mixtures of ionic and nonionic photoacid generators are used.

The photoresist composition is formed by blending the ingredients in a suitable photoresist solvent. In the preferred embodiment, the amount of polymer in the photoresist preferably ranges from 90% to about 99.5% and more preferably from about 95% to about 99% based on the weight of the solid; i.e., non-solvent photoresist components. In the preferred embodiment, the photoactive compound is present in the photoresist in an amount of from about 0.5% to about 10% preferably from about 1% to about 5% based on the weight of the solid photoresist components. In producing the photoresist composition, the solid components of the photoresist are mixed with such solvents as propylene glycol mono-alkyl ether, propylene glycol alkyl ether acetate, butyl acetate, xylene, ethylene glycol monoethyl ether acetate, propylene glycol mono-methyl ether acetate, 2-heptanone, ethyl lactate, ethyl-3-ethoxypropionate, and mixtures of ethyl lactate and ethyl-3-ethoxypropionate, among others.

Additives such as colorants, non-actinic dyes, anti-striation agents, plasticizers, adhesion promoters, coating aids, speed enhancers and surfactants may be added to the photoresist composition. A sensitizer that transfers energy from a particular range of wavelengths to a different exposure wavelength may also be added to the photoresist composition. In some cases bases or photoactive bases are added to the photoresist to control the profiles of the imaged photoresist. Nitrogen containing bases are preferred, specific examples of which are amines, such as triethylamine, triethanolamine, aniline, ethylenediamine, pyridine, tetraalkylammonium hydroxide or its salts. Examples of photosensitive bases are diphenyliodonium hydroxide, dialkyliodonium hydroxide, trialkylsulfonium hydroxide, etc. The base may be added at levels up to 75 mole % relative to the photoacid generator.

Crosslinking additives may also be added to the photoresist to insolubilize the exposed regions and thus form negative images. Suitable crosslinking agents are bisazides, alkoxymethylmelamines or alkoxymethylglycourils.

The prepared photoresist composition solution can be applied to a substrate by any conventional method used in the photoresist art, including dipping, spraying, whirling and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist may also be coated over anti-reflective coatings.

The photoresist composition solution is then coated onto the substrate, and the substrate is treated at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature treatment is conducted until substantially all of the solvents have evaporated and a thin coating of photoresist composition, on the order of half a micron (micrometer) in thickness, remains on the substrate. In a preferred embodiment the temperature is from about 95° C. to about 120° C. The treatment is conducted until the rate of change of solvent removal becomes relatively insignificant. The temperature and time selection depends on the photoresist properties desired by the user, as well as the equipment used and commercially desired coating times. The coating substrate can then be imagewise exposed to actinic radiation, e.g., ultraviolet radiation, at a wavelength of from about 100 nm (nanometers) to about 300 nm, x-ray, electron beam, ion beam or laser radiation, in any desired pattern, produced by use of suitable masks, negatives, stencils, templates, etc.

The photoresist is then subjected to a post exposure second baking or heat treatment before development. The heating temperatures may range from about 90° C. to about 160° C., more preferably from about 100° C. to about 130° C. The heating may be conducted for from about 30 seconds to about 5 minutes, more preferably from about 60 seconds to about 90 seconds on a hot plate or about 15 to about 45 minutes by convection oven.

The exposed photoresist-coated substrates are developed to remove the image-wise exposed areas by immersion in a developing solution or developed by spray, puddle or spray-puddle development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides or supercritical carbon dioxide. One preferred developer is an aqueous solution of tetramethyl ammonium hydroxide. After removal of the coated wafers from the developing solution, one may conduct an optional post-development heat treatment or bake to increase the coating's adhesion and chemical resistance to etching conditions and other substances. The post-development heat treatment can comprise the baking of the coating and substrate below the coating's softening point or UV hardening process. In industrial applications, particularly in the manufacture of microcircuitry units on silicon/silicon dioxide-type substrates, the developed substrates may be treated with a buffered, hydrofluoric acid etching solution or dry etching. In some cases metals are deposited over the imaged photoresist.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

EXAMPLES

Glossary

| | |
|---|---|
| MCA | Methyl 2-cyanoacrylate |
| BNC | t-Butyl Norbornene carboxylate |
| NB | Norbornene |
| NBHFtB | Norbornene hexafluoro-tert-butanol (α,α-bis(trifluoromethyl)bicyclo[2.2.1]hept-5-ene-2-ethanol) |

-continued

Glossary

| | |
|---|---|
| HNC | Hydroxyethyl norbornene carboxylate |
| NCA | Norbornene carboxylic acid |
| NBDCA | cis-Norborn-5-ene-endo-2,3-dicarboxylic anhydride (Nadic anhydride) |
| THF | Tetrahydrofuran |
| AIBN | 2,2'-Azobisisobutyronitrile |
| $M_w$ | Weight average Molecular weight |
| $M_n$ | Number average Molecular weight |
| PD | Polydispersity |
| GPC | Gel permeation chromatography |

Example 1

Synthesis of Methyl 2-Cyanoacrylate/T-Butyl Norbornene Carboxylate Copolymer

To a 35 (milliliter) ml pressure tube equipped with a Teflon coated stir bar and a threaded Teflon cap with O-ring was added MCA (1.46 g, 13.1 mmol), BNC (2.54 g, 13.1 mmol), THF (4 g), AIBN (120 mg) and acetic acid (200 mg). The reaction mixture was deaerated with nitrogen at a flow rate of 30 ml/min for 15 minutes. The vessel was then immediately capped tight using the Teflon screw cap. The vessel was placed in an oil-bath, which was preheated to 72° C. The reaction was allowed to proceed for three hours. The viscous reaction mass was cooled to room temperature and diluted with 20.5 ml of THF. The solution was poured dropwise into 75 ml of hexane while stirring. The white polymer was filtered, washed with hexane and dried overnight in a vacuum oven at 55° C. The isolated polymer had a yield of 64.6%. The polymer contained blocks of methyl cyanoacrylate. This block configuration yields acidic methylene groups in the backbone which can be utilized favorably. The molecular weight of the copolymer was determined using GPC technique (THF, polystyrene standards) and found to be $M_w$=5612, $M_n$=2349 and PD=2.39. The presence of both methyl ester and t-butyl ester containing monomers was verified by proton NMR (δ1.52, methyl and δ3.94, t-butyl). From the integration of these two peaks, the polymer was found to be contain 64% MCA and 36% BNC. The $T_g$ of the polymer was measured using Differential Scanning Calorimeter (DSC) (TA Instruments, Model 2920) and found to be 137° C.

Example 2

Synthesis of Methyl 2-Cyanoacrylate/Norbornene Hexafluoro-Tert-Butanol Copolymer To a 35 ml pressure tube equipped with a Teflon coated stir bar and a threaded Teflon cap with O-ring was added MCA (1.15 g, 10.4 mmol), NBHFtB (2.85 g, 10.4 mmol), THF (4 g), AIBN (120 mg) and acetic acid (200 mg). The reaction mixture was deaerated with nitrogen at a flow rate of 30 ml/min for 15 minutes. The reaction vessel was then immediately capped tight using the Teflon screw cap. The vessel was placed in an oil-bath, which was preheated to 72° C. The reaction was allowed to proceed for three hours. The viscous reaction mass was cooled to room temperature and diluted with 20.5 ml of THF. The solution was poured dropwise into 75 ml of hexane while stirring. The white polymer was filtered, washed with hexane and dried overnight in a vacuum oven at 55° C. The yield of polymer was 61.1%. The molecular weight was observed to be Mw=2730, Mn=1576, and PD=1.73. The polymer may be further reacted with a compound which gives an acid or base labile group on the polymer. The $T_g$ of the polymer was measured using DSC (TA Instruments, Model 2920) and found to be 163° C.

Example 3

Synthesis of Methyl 2-Cyanoacrylate/Norbornene Copolymer

To a 35 ml pressure tube equipped with a Teflon coated stir bar and a threaded Teflon cap with O-ring was added MCA (2.17 g, 19.5 mmol), NB (1.83 g, 19.5 mmol), THF (4 g), AIBN (120 mg) and acetic acid (200 mg). The reaction mixture was deaerated with nitrogen at a flow rate of 30 ml/min for 15 minutes. The reaction vessel was then immediately capped tight using the Teflon screw cap. The vessel was placed in an oil-bath, which was preheated to 72° C. The reaction was allowed to proceed for three hours. The viscous reaction mass was cooled to room temperature and diluted with 20.5 ml of THF. The solution was poured dropwise into 75 ml of hexane while stirring. The white polymer was filtered, washed with hexane and dried overnight in a vacuum oven at 55° C. The yield of the isolated polymer was 76.6%. The polymer was found to have a molecular weight of 11617 ($M_w$) with PD of 1.86.

Example 4

Synthesis of Methyl 2-Cyanoacrylate/T-Butyl Norbornene Carboxylate Copolymer To a 35 ml pressure tube equipped with a Teflon coated stir bar and a threaded Teflon cap with O-ring was added MCA (1.46 g, 13.1 mmol), BNC (5.08 g, 26.2 mmol), THF (4 g), AIBN (120 mg) and acetic acid (200 mg). The reaction mixture was deaerated with nitrogen at a flow rate of 30 ml/min for 15 minutes. The reaction vessel was then immediately capped tight using the Teflon screw cap. The vessel was placed in an oil-bath, which was preheated to 72° C. The reaction was allowed to proceed for three hours. The viscous reaction mass was cooled to room temperature and diluted with 10.5 ml of THF. The solution was poured dropwise into 85 ml of hexane while stirring. The white polymer was filtered, washed with hexane and dried overnight in a vacuum oven at 55° C. The yield of the isolated polymer was found to be 67.3%. The polymer obtained was an alternating polymer. The weight average molecular weight was found to be 7987 g/mole with polydispersity of 2.92. $^1$H NMR indicated the presence of both methyl and t-butyl ester of MCA and BNC respectively. The monomer ratio in the polymer was found to be 53:47 (MCA:BNC).

Example 5

Synthesis of Methyl 2-Cyanoacrylate/Cis-Norborn-5-Ene-Endo-2,3-Dicarboxylic Anhydride Copolymer To a 35 ml pressure tube equipped with a Teflon coated stir bar and a threaded Teflon cap with O-ring was added MCA (1.62 g, 14.5 mmol), NBDCA (2.38 g, 14.5 mmol), THF (6 g), AIBN (120 mg) and acetic acid (200 mg). The reaction mixture was deaerated with nitrogen at a flow rate of 30 ml/min for 15 minutes. The reaction vessel was then immediately capped tight using the Teflon screw cap. The vessel was placed in an oil-bath, which was preheated to 72° C. The reaction was allowed to proceed for three hours. The viscous reaction mass was cooled to room temperature and diluted with 20.5 ml of THF. The solution was poured dropwise into 75 ml of hexane while stirring. The white polymer was filtered, washed with hexane and dried overnight in a vacuum oven at 55° C. The yield of copolymer was 66.5%. The molecular weight was observed to be $M_w$=1102.

Example 6

Synthesis of Methyl 2-Cyanoacrylate/T-Butyl Norbornene Carboxylate/Hydroxyethyl Norbornene Carboxylate/Norbornene Carboxylic Acid Polymer To a 35 ml pressure tube equipped with a Teflon coated stir bar and a threaded Teflon cap with O-ring was added MCA (1.5 g, 13.5 mmol), BNC (1.83 g, 9.4 mmol), HNC (0.49 g, 2.7 mmol), NCA (0.18 g, 1.3 mmol), THF (4 g), AIBN (120 mg) and acetic acid (200 mg). The reaction mixture was deaerated with nitrogen at a flow rate of 30 ml/min for 15 minutes. The reaction vessel was then immediately capped tight using the Teflon screw cap. The vessel was placed in an oil-bath, which was preheated to 72° C. The reaction was allowed to proceed for three hours. The viscous reaction mass was cooled to room temperature and diluted with 20.5 ml of THF. The solution was poured dropwise into 75 ml of hexane while stirring. The white polymer was filtered, washed with hexane and dried overnight in a vacuum oven at 55° C. The yield of the polymer was 70.4%. The molecular weight of the polymer was 4371 with polydispersity of 2.84.

Example 7

Synthesis of Methyl 2-Cyanoacrylate/T-Butyl Norbornene Carboxylate Copolymer To a 35 ml pressure tube equipped with a Teflon coated stir bar and a threaded Teflon cap with O-ring was added MCA (1.46 g, 13.1 mmol), BNC (5.08 g, 26.2 mmol), THF (4 g), AIBN (120 mg) and acetic acid (200 mg). The reaction mixture was deaerated with nitrogen at a flow rate of 30 ml/min for 15 minutes. The reaction vessel was then immediately capped tight using the Teflon screw cap. The vessel was placed in an oil-bath, which was preheated to 72° C. The reaction was allowed to proceed for six hours. The viscous reaction mass was cooled to room temperature and diluted with 10.5 ml of THF. The solution was poured dropwise into 125 ml of hexane while stirring. The white polymer was filtered, washed with hexane and dried overnight in a vacuum oven at 55° C. The yield of the isolated polymer was found to be 80.6%. The weight average molecular weight was found to be 7613 with polydispersity of 3.97. $^1$H NMR indicated the presence of both methyl (($\delta$1.53) and t-butyl ($\delta$3.95) ester of MCA and BNC respectively. The monomer ratio in the polymer was found to be 52:48 (MCA:BNC).

Example 8

The Resist Composition and Lithographic Evaluation at 193 nm

The copolymer from Example 1 was dissolved in PGMEA to make 11.5% solution. To this solution, 5% of triphenylsulfonium nonafluorobutane sulfonate based on the weight of the copolymer was added. The resist composition was then spin coated over a silicon wafer which had been pretreated with hexamethylsilazane (HMDS) and coated with of 39 nm thick bottom antireflective coating, AZ® Exp ArF-1C (available from Clariant Corp., 70, Meister Ave., Somerville, N.J. 08876). The substrate was baked at 110° C. for 90s to obtain a 390 nm photoresist film. The film was then exposed with ArF excimer laser stepper (193 nm, NA=0.6, σ=0.7) using binary mask. The exposed film was baked at 150° C. for 90s on a hot plate and the pattern was developed using 0.265N tetramethylammonium hydroxide. 0.16 μm line-space patterns were resolved at a dose of 13 mJ cm$^{-2}$.

Example 9

The Photoresist Composition and Lithographic Evaluation at 193 nm

The UV transmittance of the copolymer (Example 4) was measured using 390 nm thick film of the copolymer which was obtained by spin coating a 11.5% copolymer solution in PGMEA onto a quartz substrate. The absorptivity of this polymer at 193 nm wavelength was determined to be 0.237 μm$^{-1}$.

The copolymer of Example 4 was dissolved in PGMEA to make 11.5% solution. To this solution, 5% of triphenylsulfonium nonafluorobutane sulfonate based on the weight of the copolymer was added. The resist composition was then spin coated over a silicon substrate which had been pretreated with hexamethylsilazane (HMDS) and coated with of 39 nm thick bottom antireflective coating, AZ® Exp ArF-1C (available from Clariant Corp., 70, Meister Ave., Somerville, N.J. 08876). The substrate was baked at 110° C. for 90s to obtain a 390 nm film. The film was then exposed with ArF excimer laser stepper (193 nm, NA=0.6, σ=0.7) using binary mask. The exposed film was baked at 110° C. for 90s on a hot plate and the pattern was developed using 0.265N tetramethylammonium hydroxide. 0.13 μm line-space patterns were resolved at a dose of 10 mJ cm$^{-2}$.

What is claimed is:

1. A photoresist composition comprising a copolymer, a photoactive component, and a solvent, where the copolymer comprises at least one ethylenic unit derived from monomers selected from

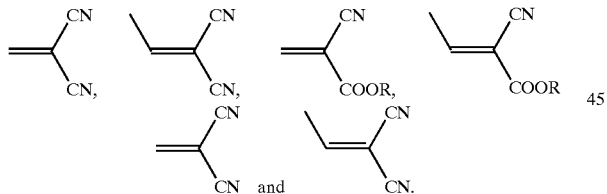

where R is $(C_1-C_{10})$alkyl, and at least one cyclic unit of structure 2, and where structure 2 is

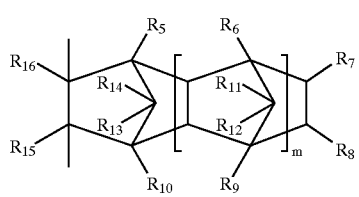

(2)

where $R_5$–$R_{14}$ are independently hydrogen, $(C_1-C_5)$alkyl, halogen, carboxylic acid, $(C_1-C_{10})$alkylOCOalkyl, cyano (CN), $(C_1-C_{10})$ secondary or tertiary carboxylate, substituted pinacol, fluoroalkyl, an acid labile group, a base labile group, $W(CF_3)_2OH$ is capped and wherein W is $(C_1-C_8)$ alkyl or $(C_1-C_8)$alkyl ether, and wherein $R_7$ and $R_8$ may be linked to form a cyclic non-aromatic structure, $R_{15}$ and $R_{16}$ are hydrogen or $(C_1-C_4)$alkyl, and m is 0–3.

2. The photoresist composition according to claim 1, where the acid labile group is selected from tert-butoxycarbonyl, tert-pentyloxycarbonyl, isobornyloxycarbonyl, cyclohexyioxycarbonyl, 2-alkyl-2-admantyloxycarbonyl, tetrahydrofuranyloxycarbonyl, tetrahydropyranyloxycarbonyl, substituted or unsubstituted methoxymethoxycarbonyloxy, βoxycarbonyloxy-β-methyl-δ-valerolactone, β-carbonyloxy-β-methyl-γ-butyrolactone, tert-butoxycarbonyloxy, tert-pentyloxycarbonyloxy, isobornyloxycarbonyloxy, cyclohexyloxycarbonyloxy, 2-alkyl-2-admantyloxycarbonyloxy, tetrahydrofuranyloxycarbonyloxy, tetrahydropyanyloxycarbonyloxy, substituted or unsubstituted methoxymethoxycarbonyloxy, β-oxycarbonyloxy-β-methyl-δ-valerolactone, β-oxycarbonyloxy-β-methyl-γ-butyrolactone, tert-butoxy, tert-pentyloxy, isobornyloxy, cyclohexyloxy, 2-alkyl-2-admantyloxy, tetrahydrofuranyloxy, tetrahydropyranytoxy, substituted or unsubstituted methoxymethoxy, β-oxy-β-methyl-δ-valerolactone, and β-oxy-β-methyl-γ-butyrolactone, and where the acid labile group is connected directly to the polymer backbone or through a connecting group.

3. The photoresist composition according to claim 1, where the nonaromatic structure is a lactone or anhydride.

4. The photoresist composition according to claim 1, where the cyclic unit is derived from monomers selected from

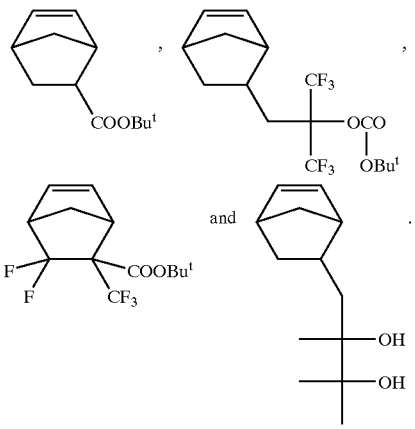

5. The photoresist composition according to claim 1, where the ethylenic unit is at a level of at least 40 mole %.

6. The photoresist composition according to claim 1, where the ethylenic unit is at a level less than 80 mole %.

7. The photoresist composition according to claim 1, where the weight average molecular weight is less than 200,000.

8. The photoresist composition according to claim 1, where the weight average molecular weight is greater than 1,000.

9. The photoresist composition according to claim 1, further comprising additional comonomers.

10. The photoresist composition according to claim 9, where the additional comonomers are selected from acrylates, methacrylates, styrenes, hydroxystyrene, hydroxyhexafluoroisopropylstyrene, vinyl ethers, vinyl acetates, tetrafluoroethylene, meleic anhydride and itaconic anhydride and their fluorinated homologues.

11. The photoresist composition according to claim 9, where the additional monomer is at a level less than 30 mole %.

12. The photoresist composition according to claim 1, where the copolymer has an absorption coefficient at an exposure wavelength of less than 4/micron.

13. The photoresist composition according to claim 12, where the photoacid generator is selected from diazonium salts, iodonium salts, sulfonium salts, sulfones, hydroxamic acid esters, halides and sulfonic esters.

14. The photoresist composition according to claim 1, where the solvent is selected from propylene glycol monoalkyl ether, propylene glycol alkyl ether acetate, butyl acetate, xylene, ethylene glycol monoethyl ether acetate, propylene glycol mono-methyl ether acetate, 2-heptanone, ethyl lactate, ethyl-3-ethoxypropionate, mixtures of ethyl lactate and ethyl-3-ethoxypropionate, and mixtures thereof.

15. The photoresist composition according to claim 1, further comprising a dissolution inhibitor.

16. The photoresist composition according to claim 1, where the photoactive component is selected from a photoacid generator, a photobase generator or mixtures thereof.

17. The photoresist composition according to claim 1, further comprising a base.

18. The photoresist composition according to claim 17, where the base is selected from triethylamine, triethanolamine, aniline, ethylenediamine, pyridine, triphenyliodonium hydroxide, dialkyliodonium hydroxide, and trialkylsulfonium hydroxide.

19. The process of imaging a photoresist composition comprising the steps of:
 a) coating a substrate with a film of photoresist composition of claim 1;
 b) baking the substrate to substantially remove the solvent;
 c) imagewise irradiating the photoresist film;
 d) baking the photoresist film; and,
 e) developing the irradiated photoresist film using an alkali developer.

20. The process of claim 19, wherein the photoresist film is imagewise irradiated using light of wavelength in the range of 100 nm to 300 nm.

21. The process of claim 19, wherein the heating in step d) ranges from a temperature of from about 90°C. to about 150°C. for from about 30 seconds to about 180 seconds on a hot plate or from about 15 minutes to about 40 minutes in an oven.

22. The process of claim 19, wherein the alkali developer comprises an aqueous solution of tetramethyl ammonium hydroxide.

* * * * *